Figure 1:
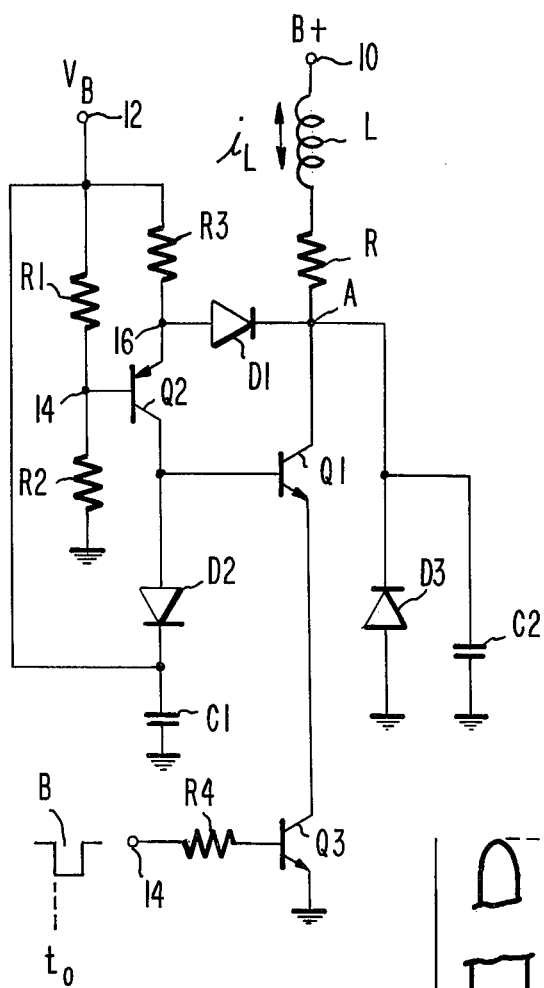

United States Patent [19]

Clark, Jr. et al.

[11] 4,109,166

[45] Aug. 22, 1978

[54] CLAMPING CIRCUIT

[75] Inventors: Charles Albert Clark, Jr., Chatsworth; Kenneth Charles Adam, Thousand Oaks, both of Calif.

[73] Assignee: RCA Corporation, New York, N.Y.

[21] Appl. No.: 788,035

[22] Filed: Apr. 15, 1977

[51] Int. Cl.² ............................................. H03K 5/08
[52] U.S. Cl. .................................. 307/237; 307/228; 307/300; 330/110
[58] Field of Search ............... 307/228, 237, 300, 315; 330/110

[56] References Cited

U.S. PATENT DOCUMENTS 3,311,757  3/1967  Matsumoto ..................... 307/237 X

*Primary Examiner*—John Zazworsky
*Attorney, Agent, or Firm*—H. Christoffersen; Samuel Cohen

[57] ABSTRACT

The collector current of a first transistor serves as the base drive current for a second transistor of opposite conductivity type than the first transistor. When conduction occurs through the collector-to-emitter path of the second transistor, a conducting diode connected between the emitter of the first transistor and the collector of the second transistor clamps this collector to a relatively fixed voltage level referenced to the fixed base voltage of the first transistor. This prevents saturation of the second transistor and thus reduces the "storage delay", that is the turn-off time delay of the second transistor. In addition, the charge stored at the base electrode of the second transistor is removed when its collector-to-emitter current flow is interrupted to further reduce the turn-off time of this transistor.

12 Claims, 2 Drawing Figures

CLAMPING CIRCUIT

High-voltage, high-power transistors such as those used in television receiver horizontal output stages are capable of storing large amounts of base-collector charge. In applications where repeatable turn-off times are necessary, this charge must be minimized and removed quickly to keep the transistor turn-off time from varying widely from device to device.

A circuit which includes these features is the subject of the present application. The charge stored in the base of a transistor is minimized by clamping the collector voltage of the transistor to a level at which saturation does not occur. Means are provided at the time of turn off of the transistor for removing any such charge which does become stored.

Figure 2:
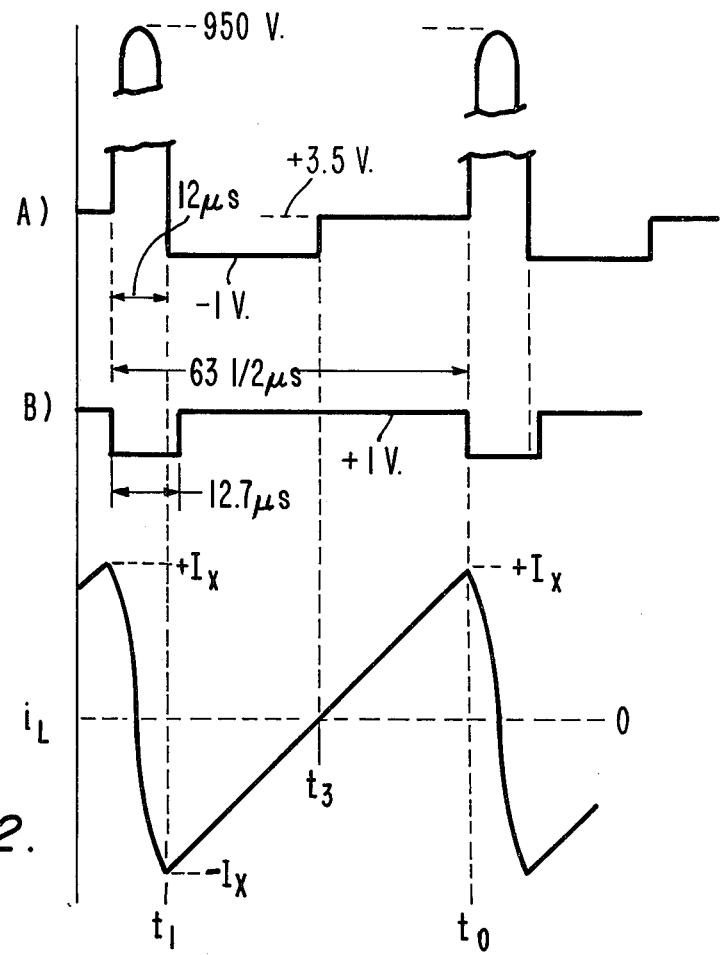

In the drawing:

FIG. 1 is a schematic circuit diagram of a preferred embodiment of the invention; and FIG. 2 is a drawing of waveforms present in the circuit of FIG. 1.

The circuit of FIG. 1 includes a high voltage NPN transistor Q1 which is connected at its emitter electrode to the collector electrode of NPN transistor Q3, which may be a low voltage transistor, and at its collector electrode to one terminal of resistor R. The resistor R is connected at its other terminal through inductor L to the B+ voltage supply terminal 10. The inductor L, in one practical circuit, represents the combined inductance of a kinescope yoke and a flyback transformer, and the resistor R represents the resistance of the inductive elements and can also include an additional lumped resistance element. The collector electrode of transistor Q1 is also connected to the cathode of diode D3, the anode of which is connected to a point of reference potential, shown as ground. A capacitor C2 is connected across the diode.

The circuit includes also a PNP transistor Q2. The emitter of this transistor is connected through resistor R3 to terminal 12 for a source of bias voltage $V_B$. The latter may be of a value such as 10 volts or so and the B+ voltage may be of a value such as 95 volts. A diode D1 is connected at its anode to the emitter of transistor Q2 and at its cathode to the collector of transistor Q1. The base of transistor Q2 is connected to the tap 14 of a voltage divider R1, R2, this voltage divider being connected between terminal 12 and ground. The collector of transistor Q2 is connected to the base of transistor Q1 and to the anode of diode D2. The cathode of this diode is connected to terminal 12 and through capacitor C1 to ground. The negative-going trigger signal B is applied to terminal 14, this terminal being connected through resistor R4 to the base of transistor Q3. The emitter of this transistor is connected to ground.

The operation of the circuit of FIG. 1 may be better understood by referring both to FIGS. 1 and 2. Assume that it is time $t_0$ which is the time that the negative-going edge of the trigger pulse B occurs. The transition may be from a level of +1 volt to −3 volts. This turns off transistor Q3 and when transistor Q3 turns off, transistor Q1 turns off. The turn-off mechanism of Q1 will be discussed later. At the time of turn off, there is a maximum value of current $I_x$ flowing through the inductor L. The inductor L and capacitor C2 together form a parallel-resonant circuit and this resonant circuit starts to ring at its resonant frequency. The voltage A at the collector of transistor Q1 initially is at a low positive value (+3.5 volts in this example). The ringing is manifested as the positive half period of a sinusoid. As shown in FIG. 2, this half period may be a duration of 12 microseconds ($\mu s$). The peak of the sinusoid may be at a level of 950 volts or so and this peak is reached when the current $i_L$ which flows through the inductance, passes through zero.

At time $t_1$, which is 12 $\mu s$ from time $t_0$, the voltage at A attempts to swing negative. When it reaches the threshold voltage of the diode D3, which threshold voltage may be of the order of a volt, the diode conducts and clamps the collector of transistor Q1 at the negative voltage level of −1 volt. The voltage across the inductor is now clamped (both A and B+ are at fixed levels) and the current flow through the inductor starts to linearly decrease from its maximum negative value $-I_x$ toward zero. Note that the slope of the current wave is positive. The diode D1 also is conducting at this time but has little effect on the circuit operation as resistor R3 restricts the level of current which may flow through the diode. As the voltage at A is −1 volt, the voltage at node 16 is sufficiently low that transistor Q2 is cut off, no current flowing through its emitter-base junction.

As already mentioned, the current through the inductor is at its maximum level $+I_x$ at time $t_0$. Thereafter, the current through the inductor changes from its maximum value $+I_x$ through zero to its maximum negative value $-I_x$, reaching the level $-I_x$ in about 12 $\mu s$. The shape of this "flyback" current waveform is that of a cosine function and is due to the ringing of the L, C2 resonant circuit. The negative-going pulse B has a duration slightly greater than 12 $\mu s$ to insure that the transistor Q3 remains off at this time. Were the transistor Q3 permitted to turn on prematurely, while the collector electrode of transistor Q1 were still relatively positive, conduction would occur through transistors Q1 and Q3 and this would waste power and prematurely damp the ringing and, in this way, distort the flyback current waveform through the inductor.

After the current through the inductor reaches its maximum negative value $-I_x$ at time $t_1$, the current changes value from $-I_x$ toward zero, which it reaches at time $t_3$, to its maximum positive value $+I_x$ which it reaches at time $t_0$, which is at the beginning of the next cycle. It may be assumed for purposes of the present explanation, that the ramp between $-I_x$ and $+I_x$ is linear so that $t_3$ occurs midway between $t_1$ and the following $t_0$. When the current through the inductor passes through zero, the voltage A starts to go more positive than −1 volt, whereby the diode D3 turns off. When this occurs, the collector of transistor Q1 is no longer clamped to −1 volt. The voltage A, however, is still relatively more negative than the voltage at the emitter electrode of transistor Q2. Accordingly, the diode D1, which already is conducting when diode D3 is on, takes over control of the level to which the collector electrode of transistor Q1 is to be clamped.

As previously mentioned, the base of transistor Q2 is clamped to a fixed voltage level by the voltage divider R1, R2. Assume this level to be +3.5 volts. When diode D3 goes off, the voltage A increases from −1 volt through zero toward a more positive level and the voltage at node 16 also goes more positive until transistor Q2 turns on. As transistor Q2 is conducting, node 16 of the circuit, which is at the emitter electrode of transistor Q2, is at a voltage level 1$V_{BE}$ higher than that of node 14 (where $V_{BE}$ is the base-emitter junction voltage of transistor Q2 when it conducts). Assuming diode D1 to be implemented by a single, high-voltage diode whose forward voltage drop is also about $1V_{BE}$, the collector of transistor Q1 is at a voltage $1V_{BE}$ lower than that of node 16 so that the voltage at the collector of transistor Q1 is substantially equal to that at the base of transistor Q2. Thus, the circuit just described automatically clamps the collector electrode of transistor Q1 to the voltage at the base of transistor Q14 when diode D3 turns off and transistor Q1 starts to conduct.

Exact matching of the $V_{BE}$ of transistor Q2 to the forward voltage of diode D1 is not critical. However, to achieve the clamping desired, the circuit parameters should be such that when diode D3 goes off, the diode D1 remains on and the voltage at 16 reaches a level such that the emitter-base junction of transistor Q2 conducts. The clamping level should be chosen so that transistor Q1 is not in saturation while conducting, so that the turn-off delay of the circuit (when transistor Q1 is later turned off) is minimized.

Returning for a moment to a previous time period, it will be recalled that at time $t_0$ transistor Q3 is turned off by the input wave B. At a time slightly after $t_1$, the wave B goes positive to about +1 volt and this conditions transistor Q3 to conduct. However, as may be seen in FIG. 2, at this time the diode D3 is conducting and holding the collector of transistor Q1 at −1 volt. Accordingly, while transistor Q3 is conditioned to conduct, transistor Q1 is off so that no forward current flows through the emitter-to-collector paths of transistors Q1 and Q3.

At time $t_3$, when the current through the inductor passes through zero, the voltage at A starts to increase. As soon as it becomes sufficiently positive, transistor Q1 turns on and current flows through the path comprising the emitter-to-collector paths of transistors Q1 and Q3. Transistor Q2 is on and its emitter-to-collector current passes through the base-emitter junction of transistor Q1, attempting to turn this transistor on hard. The action previously described now occurs, that is, the diode D1 is on as the voltage at point A differs from the voltage at point 16 by a sufficient amount to cause conduction in the forward direction through diode D1. This clamps the collector of transistor Q1 to the voltage on the base of transistor 14 which, in this example, is +3.5 volts.

The conduction through diode D1 affects the conduction through transistor Q2. As the current through diode D1 increases, additional current flow through resistor R3 and the emitter voltage of transistor Q2 becomes less positive. This decreases the emitter-to-collector current of transistor Q2 and this, in turn, reduces the base drive current to transistor Q1. Thus, the current flow through transistor Q1 decreases and the collector voltage of transistor Q1 continues to be held at the +3.5 volt level. This negative feedback action continues for the remainder of the period, that is, until the next time $t_0$. Any tendency for an increase in the collector voltage A will diminish the amount of current flowing through diode D1, increasing the conduction through the emitter-to-collector path of transistor Q2. This results in increased base drive to transistor Q1, pulling the collector voltage of transistor Q1 back down to the clamped level. In similar fashion, the negative feedback also counteracts any tendency of the collector voltage to decrease.

Assuming that diode D1 is a semiconductor junction diode formed of the same material as the base-emitter junction of transistor Q1, there will be automatic temperature compensation in the sense that variations in temperature will affect the voltage across diode D1 in the same way as the voltage across the base-emitter junction of transistor Q2 is affected. Accordingly, variations in temperature will not substantially affect the clamping level of the collector electrode of transistor Q1—it will remain at the same level as the base voltage of transistor Q2.

At time $t_0$, when the wave B goes negative to −3 volts, it is desirable that transistor Q3 immediately cut off and immediately interrupt the collector-to-emitter current flow through transistor Q1. However, at this time there is substantial charge stored in the base of transistor Q1 and if it were permitted to remain, it would tend to maintain transistor Q1 in a conducting condition. In the present circuit this charge (holes) rapidly is removed. If flows from the base of transistor Q1 in the forward direction through the diode D2 and into capacitor C1. The charge in this capacitor now discharges through the parallel paths which include the source resistance (not shown) of the $V_B$ voltage supply, the series-connected resistors R1 and R2, and the path comprising resistor R3, the base-emitter junction of transistor Q2 and resistor R2. As the various resistances involved are of relatively low value (in one typical design the source resistance of $V_B$ was 0.5 ohms, R1=1.8 kilohm (kΩ), R2=1 kΩ, and R3=180 Ω), the charge received by capacitor C1 quickly is dissipated so that transistor Q1 turns off substantially instantaneously when B switches from +1 to −3 volts.

The example discussed of the circuit operation is an idealized case in the sense that $t_3$ occurs midway between $t_1$ and $t_0$. In one practical design, there were losses in the circuit because the inductive load was not a pure inductance. The ramp, while relatively linear, was not entirely linear. In this particular circuit, $t_3$ occurs about 20 μs after $t_1$ and $t_0$ occurs about 31½ μs after $t_3$. As in the idealized example discussed, $t_3$ is the time at which the current through the inductor L passes through zero.

While in the example illustrated, the clamping means employed is a single diode D1, alternatives are possible. For example, a zener diode may be employed or a plurality of series connected diodes, such as D1, may be employed, all poled in the same direction. The particular clamping means chosen will depend on the offset desired between the base voltage of transistor Q2 and the collector voltage of transistor Q1, and also on other circuit parameters of interest such as the temperature tracking characteristics of the devices and so on. It is also to be understood that a wide range of voltages is available at which the base of transistor Q2 may be clamped (provided its emitter is at a sufficiently higher level that conduction through the transistor will be possible) and a corresponding range of voltages to which the collector of transistor Q1 may be clamped, the collector voltage of Q1 being at a fixed voltage difference (which, in the example of FIG. 1, is zero volts) from the base voltage of transistor Q2.

While the invention has been illustrated in terms of transistors of particular types, transistors of types complementary to those illustrated may be employed, provided the power supply voltages are changed accordingly.

What is claimed is:
1. In combination:
first and second transistors of opposite conductivity types, each having base, emitter and collector elec- trodes, the collector electrode of the first transistor being connected to the base electrode of the second transistor;

means for maintaining the base electrode of the first transistor at a fixed potential with respect to ground, which is in the forward direction relative to the potential at the emitter electrode of said first transistor during the clamping of the collector electrode of said second transistor described below;

means for supplying emitter current to said first transistor, thereby conditioning said first transistor to supply its collector current as base drive current for said second transistor;

means coupled between the emitter and collector electrodes of said second transistor for conditioning said second transistor to conduct collector-to-emitter current; and clamping means connected between said emitter electrode of said first transistor and said collector electrode of said second transistor which is poled to conduct in the forward direction during conduction of current through the collector electrode-to-emitter electrode path of said second transistor for clamping the collector electrode of said second transistor to a voltage related to that at the base electrode of said first transistor.

2. In the combination as set forth in claim 1, said clamping means comprising a semiconductor junction.

3. In the combination as set forth in claim 1, said clamping means comprising a semiconductor junction having an offset voltage, when it conducts, which is substantially equal to the base-emitter voltage of said first transistor.

4. In the combination as set forth in claim 1, said means for supplying emitter current to said first transistor comprising a voltage source and resistor means coupled between said voltage source and said emitter electrode of said first transistor, whereby when conduction tends to increase through said clamping means, the voltage across said resistor means tends to increase, thereby reducing the base drive current to said second transitor, thereby tending to maintain constant the voltage at the collector electrode of said second transistor.

5. In combination:

first and second transistors of opposite conductivity types, each having base, emitter and collector electrodes, the collector electrode of the first transistor being connected to the base electrode of the second transistor;

means for maintaining the base electrode of the first transistor at a fixed reference potential which is such that current flows between the emitter and base electrodes of said first transistor during the clamping of the collector electrode of said second transistor described below;

means for supplying emitter current to said first transistor, thereby conditioning said first transistor to supply its collector current as base drive current for said second transistor;

means coupled between the emitter and collector electrodes of said second transistor for conditioning said second transistor to conduct collector-to-emitter current, said means comprising, in series, terminals for an operating voltage source and a switch;

means for closing said switch for conditioning said second transistor to permit current flow through the collector-to-emitter electrode path of said second transistor and means for opening said switch for terminating the current flow; and clamping means connected between said emitter electrode of said first transistor and said collector electrode of said second transistor which is poled to conduct in the forward direction during conduction of current through the collector electrode-to-emitter electrode path of said second transistor for clamping the the collector electrode of said second transistor to a voltage related to said fixed reference potential at the base electrode of said first transistor.

6. In the combination as set forth in claim 5, further including:

means for removing charge carriers from the base electrode of said second transistor when said switch is opened.

7. In the combination as set forth in claim 6, said means for removing charge carriers comprising:

a capacitor connected at one terminal to a point of reference potential;

a diode connected between the other terminal of said capacitor and the base electrode of said second transistor and poled to conduct the carriers stored in the base electrode of said transistor into said capacitor; and a discharge circuit for said capacitor connected across said capacitor.

8. In the combination as set forth in claim 5, said switch comprising a third transistor of the same conductivity type as said second transistor, said third transistor having base, emitter and collector electrodes and being connected at its collector electrode to the emitter electrode of said second transistor and at its emitter electrode to one of said operating voltage terminals, and means for applying turn-on and turn-off voltages to the base electrode of said third transistor.

9. In the combination as set forth in claim 8, said means coupled between said emitter and said collector electrodes of said second transistor further including an inductance, said combination further including:

a diode connected between the collector electrode of said second transistor and a point of reference potential, said diode being poled to conduct when the voltage at said collector electrode of said second transistor is of a sense to prevent forward conduction through said second transistor; and a capacitor in circuit with said inductance and forming a parallel resonant circuit therewith which tends to ring when said switch is opened.

10. In combination:

first and second transistors of opposite conductivity types, each having base, emitter and collector electrodes, the collector electrode of said first transistor being connected to the base electrode of said second transistor;

means coupled between the base and emitter electrodes of said first transistor for conditioning the same to conduct emitter-to-collector current to the base electrode of said second transistor said means including means for maintaining the base electrode of said first transistor at a fixed reference voltage level;

means coupled between the emitter and collector electrodes of said second transistor for conditioning the same to conduct emitter-to-collector current; and a negative feedback circuit including means connecting the collector electrode of said second transistor to the emitter electrode of said first transistor, responsive to the tendency of the collector voltage of said second transistor to change in one sense, for changing the flow of emitter-to-collector current in said first transistor in the opposite sense, to thereby cause the base current supplied to said second transistor in a sense to counteract the tendency of the collector voltage of said second transistor to change.

11. In the combination as set forth in claim 10, further including:
   means for interrupting the flow of emitter-to-collector current in said second transistor; and
   means for concurrently discharging charge carriers which may be stored at the base electrode of said second transistor to thereby increase the turn-off speed of said second transistor.

12. In the combination as set forth in claim 11, said negative feedback circuit including means for clamping the collector electrode of said second transistor at a fixed offset voltage relative to said fixed reference voltage level at the base electrode of the first transistor.

* * * * *